United States Patent [19]

Aschwanden

[11] 4,227,186

[45] Oct. 7, 1980

[54] SELF-STABILIZING ANALOG TO DIGITAL CONVERTER USEFUL IN PHASE LOCKED LOOP TUNING SYSTEMS

[75] Inventor: Felix Aschwanden, Thalwil, Switzerland

[73] Assignee: RCA Corporation, New York, N.Y.

[21] Appl. No.: 10,868

[22] Filed: Feb. 9, 1979

[30] Foreign Application Priority Data

Mar. 20, 1978 [GB] United Kingdom ............... 10999/78
Apr. 19, 1978 [GB] United Kingdom ............... 15509/78

[51] Int. Cl.$^2$ ............................................. H03K 13/20
[52] U.S. Cl. ........................ 340/347 CC; 340/347 AD
[58] Field of Search ................. 340/347 AD, 347 CC, 340/347 NT, 347 M; 324/99 D, 130; 325/464

[56] References Cited

U.S. PATENT DOCUMENTS

| | | | |
|---|---|---|---|
| 3,070,786 | 12/1962 | MacIntyre | 340/347 CC |
| 3,478,348 | 11/1969 | Molyneux | 340/347 AD |
| 4,050,065 | 9/1977 | Mosley | 340/347 CC |
| 4,085,371 | 4/1978 | Mogi | 325/464 |

OTHER PUBLICATIONS

Schmid "Electronic Design" No. 26, Dec. 19, 1968, pp. 61–65.
Schmid "Electronic Design" No. 1, Jan. 4, 1964, pp. 104–108.

Primary Examiner—Charles D. Miller
Attorney, Agent, or Firm—Eugene M. Whitacre; Paul J. Rasmussen; Peter M. Emanuel

[57] ABSTRACT

A phase locked loop tuning system of a radio receiver includes circuitry for converting the setting of a potentiometer to a binary word for controlling the frequency of the local oscillator signal generated by the phase locked loop. The conversion circuitry includes a voltage comparator having a first input coupled to the wiper of the potentiometer and a second input coupled to a first capacitor. The first capacitor is charged during a first predetermined period. The time at which the voltage developed across the first capacitor exceeds the voltage at the wiper determines the binary control word. To self-stabilize the conversion circuitry, a second capacitor for developing the reference voltage for the potentiometer is charged during a second predetermined period in accordance with the level of the voltage developed across the first capacitor at the end of the first predetermined period.

10 Claims, 4 Drawing Figures

SELF-STABILIZING ANALOG TO DIGITAL CONVERTER USEFUL IN PHASE LOCKED LOOP TUNING SYSTEMS

BACKGROUND OF THE INVENTION

The present invention relates to the field of analog to digital conversion apparatus for converting the setting of a potentiometer or like device to a binary word.

Various control applications require apparatus for converting the setting of a potentiometer to a binary word. For example, U.S. Pat. No. 4,097,810 and copending U.S. patent applications Ser. Nos. 925,655 and 935,204 disclose tuning systems for radio receivers including apparatus for converting the setting of a potentiometer to a binary word. The binary word controls the division factor of a programmable counter included in a phase locked loop for generating the receiver's local oscillator signal. The division factor of the programmable counter determines the frequency of the local oscillator signal.

Such tuning systems are advantageous in that while they provide a user with controls with which he is familiar, e.g., the conventional dial type adjustment for a radio receiver, the systems are compatible with digital processing circuitry such as microprocessors. The latter capability permits the addition of many user features such as storage of binary words corresponding to preferred radio stations in a memory for rapid future access. Unfortunately, the stability of such systems is limited by the environmental response and aging characteristics of the analog elements of their conversion portion. Accordingly, it is desirable that the conversion portions of such systems have stabilization provisions.

SUMMARY OF THE PRESENT INVENTION

Apparatus constructed in accordance with the present invention and useful in the above-described type of system includes comparator means for generating an output voltage having either one of two levels determined relative to amplitudes of first and second input voltages. The first input voltage is developed across first capacitor means. The first capacitive means is charged during a predetermined time interval by first charging means. A reference voltage is voltage divided by adjustable voltage divider means to generate the second input voltage. The reference voltage is generated by second capacitive means. The second capacitive means is selectively charged by second charging means in response to the level of first input voltage at the end of the predetermined time interval. Since changes which affect the first input voltage also affect the reference voltage, the time at which the relative amplitude of first and second input voltages changes and the output voltage changes levels is essentially only a function of the voltage division ratio established by the voltage division means.

DETAILED DESCRIPTION OF THE DRAWING

Figure 1:
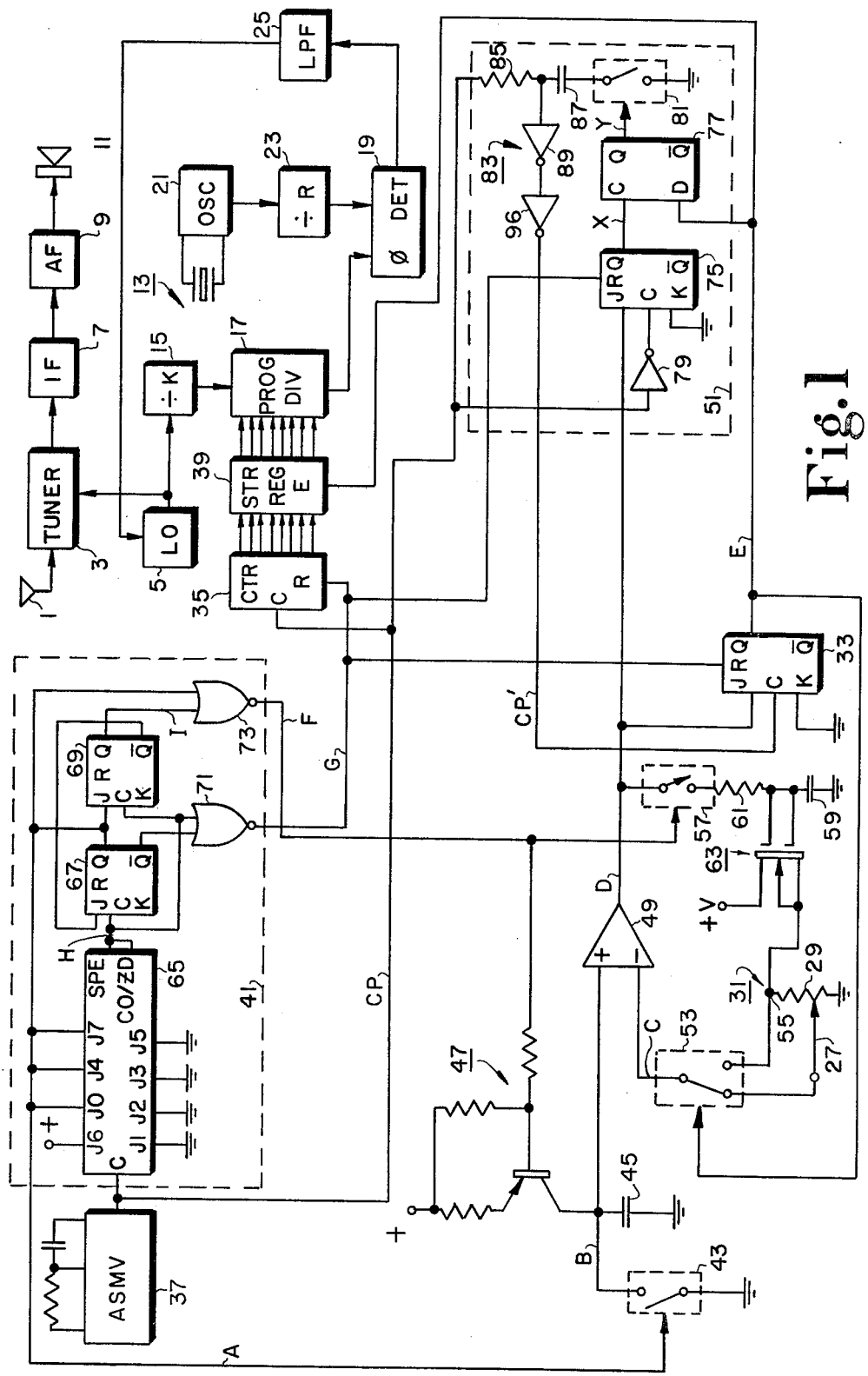
FIGS. 1 and 4 show, partially in block diagram form and partially in schematic diagram form, apparatus constructed in accordance with the present invention for converting the setting of a potentiometer to a binary word as it may be employed in tuning systems for a radio receiver.

The radio receiver of FIG. 1 includes an antenna 1, a tuner 3, a local oscillator (LO) 5, an intermediate frequency (IF) unit 7, an audio frequency (AF) unit 9 including a demodulator, and a speaker 11 arranged in the conventional fashion. LO 5 is a voltage controlled oscillator. A control voltage for controlling the frequency of LO 5 is generated by a phase locked loop (PLL) 13 in which LO 5 is included. PLL 13 also includes a fixed divider 15, a programmable divider 17, a phase detector 19, a crystal oscillator 21, a fixed divider 23 and a low pass filter (LPF) 25 arranged in a conventional configuration for tuning systems.

The frequency of LO 5 is controlled by PLL 13 so that the output signals of programmable divider 17 and fixed divider 23 have small phase and frequency deviations. In this condition, the loop is said to be locked and the relationship between the frequency, $f_{LO}$, of the LO signal generated by LO 5 and the frequency, $f_{XTAL}$, of the output signal of crystal oscillator 21 is given by the expression:

$$f_{LO} = (KN/R)f_{XTAL} \tag{1}$$

where K is the fixed division factor of fixed divider 15, N is the programmable division factor of programmable divider 17 and R is the fixed division factor of fixed divider 23. The frequency, $f_{XTAL}$, of the output signal of crystal oscillator 21 and the fixed division factor R are selected to determine the operating frequency of the loop. Fixed division factor K is selected to accommodate the operating range of programmable divider 17. The programmable factor is controlled in accordance with the selected station. By way of example, components of PLL 13 are selected to tune the receiver to FM stations in Europe. The European FM band has the following characteristics:

RF range: 87 to 108 MHz
Number of stations: 210
Spacing between stations: 0.1 MHz
IF frequency: 10.7 MHz
LO frequency range: 97.7 to 118.7 MHz Accordingly, it is desirable to select $f_{XTAL}$, R and K so that $$(K/R)f_{XTAL} = 100 \text{ KHz} \tag{2}$$

and to make N adjustable in increments of 1 between 977 and 1187.

In the receiver shown in FIG. 1, N is determined by a binary word consisting of a number, e.g., 8 of binary signals or bits (binary digits). The binary word is in turn determined by the position of a wiper or movable contact 27 along a resistive element 29 of a potentiometer 31. The specific manner in which the latter is accomplished is described below with reference made to the waveforms shown in FIG. 2.

The position of wiper 27 determines duration T of a counting interval of a signal E generated at the Q output of a J-K flip-flop (F-F) 33. During the counting interval, counter 35 counts clock pulses CP generated by a astable multivibrator (ASMV) 37 and coupled to its clock (C) input. At the end of the counting interval, signal E, which is coupled to the enable (E) input of a storage register 39, changes from a low level to a high level and storage register 39 is caused to store the binary signals representing the count accumulated by counter 35. The binary signals stored in storage register 39 are coupled to programmable divider 17 to control the programmable factor N. The binary signals stored in storage register 39 are desirably also coupled to a frequency display unit (not shown) for identifying the selected station. The binary signals stored in storage register 39 do not change, i.e., are static, as long as duration T of the counting interval is not changed.

Duration T of the counting interval of signal E is controlled in accordance with the setting of potentiometer 31 in the following manner. In response to the rising edge of a timing signal A generated by a timing control unit 41 at time T0, an electronic switch 43 is closed thereby discharging a capacitor 45 coupled in shunt with switch 43. In response to the falling edge of timing signal A at time T1, switch 43 is opened. When switch 43 is opened, a constant current source 47 begins to charge capacitor 45 to develop a linearly increasing or ramp portion of a voltage B at the noninverting (+) input of a voltage comparator 49. During this time, the setting of wiper 27 of potentiometer 31 determines the level of a voltage C developed at the inverting (−) input of voltage comparator 49. When voltage B reaches voltage C, i.e., at time T1+T, the output voltage D of comparator 49 switches from a low level to a high level. In response to the rising edge of the next clock pulse CP, J-K F-F 33 is set (i.e., its Q output changes from a low level to a high level), thereby causing the contents of counter 35 to be stored in storage register 39 as discussed above. As will be explained below, clock pulses CP generated as ASMV 37 are not directly coupled to the clock (C) input of J-K F-F 33 but are rather first processed by a hysteresis unit 51 which slightly alters their phase so that they do not occur in coincidence with the rising edges of signal E to avoid possible ambiguities.

The rising edge of signal E also initiates the self-stabilization operation of the tuning control portion of the receiver. Specifically, in response to the high level of signal E, an electronic switch 53 decouples the inverting (−) input of comparator 49 from wiper 27 and instead couples it to an end point 55 of resistive element 29. At this time, current source 47 is still enabled to charge capacitor 45. As a result, voltage B continues to increase. (However, because voltage C is at this point greater than voltage B, output voltage D of comparator 49 changes from its high level to its low level.) Voltage B continues to increase until the high level of a timing signal F generated by timing control unit 41 at a predetermined time T2 causes current source 47 to be disabled from charging capacitor 45 and an electronic switch 57 to close. When current source 47 is disabled, the voltage B stops increasing and thereafter, during the duration of the high level of timing signal F, remains substantially constant. The closure of switch 57 causes the output of comparator 49 to be coupled to a capacitor 59 through a resistor 61. The junction of capacitor 59 and resistor 61 is coupled through a high input impedance voltage follower, comprising a field effect transistor, to end point 55 of resistance element 29.

When switch 57 is closed, a negative feedback path, including resistor 61, capacitor 59 and follower 63, between the output of comparator 49 and its inverting (−) input is formed. Accordingly, comparator 49 is configured as a voltage follower during the duration of the high level of timing signal F. As a result, when switch 57 is closed, capacitor 59 will be charged or discharged until the voltage across potentiometer 31 substantially equals the voltage developed across capacitor 45 at time T2.

When timing signal F terminates, i.e., changes from its high level to its low level, at a time T3, switch 53 is caused to again couple movable contact 27 to the inverting (−) input of comparator 49 and switch 57 is caused to decouple the feedback path between the output and inverting (−) input of comparator 49. At a predetermined time after signal F terminates, timing signal A is generated. Timing signal A initiates the next cycle by causing capacitor 45 to be discharged. At the termination of timing signal A, a reset signal G is generated by timing control unit 41. Reset signal G causes counter 35 and J-K F-F 33 to be reset. During the next cycle, the voltage developed across capacitor 59 during the previous cycle, which remains substantially constant due to the high input impedance voltage follower 63, determines the reference voltage from which the voltage at wiper 27 is generated by the voltage division action of potentiometer 31.

Thus, since the reference voltage for potentiometer 31 is derived in response to the voltage B developed across capacitor 45 at time T2, changes in the charging conditions which affect voltage B at the noninverting (+) input of comparator 49 also affect voltage C at the inverting (−) input of comparator 49 in a corresponding manner. As a result, duration T of the counting interval is essentially only a function of the voltage division ratio determined by the position of wiper 27. Moreover, duration T of the counting interval is self-stabilized. That is, the stabilization of duration T of the counting interval does not require comparison to a very stable timing signal derived, for example, from a crystal oscillator. As a result, the timing of timing signals A, F and G are not critical and these signals may be derived from the clock pulses generated by a astable multivibrator as is shown.

Figure 2:
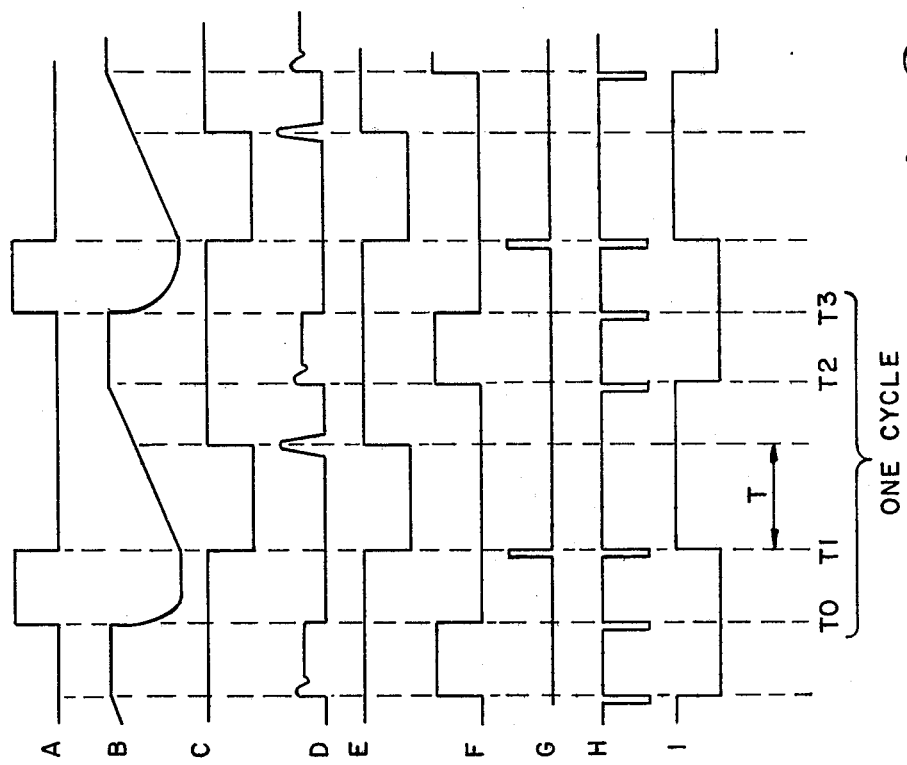
FIGS. 2 and 3 show graphical representations of certain waveforms useful in understanding the operation of the arrangement shown in FIG. 1.

The implementation of timing control unit 41 shown in FIG. 1 includes a counter 65 with J-K flip-flops 67 and 69 arranged to provide feedback for counter 65 and NOR gates 71 and 73 to combine certain internally generated timing signals to generate timing signals A, F and G in response to clock pulses CP generated by ASMV 37. Timing control unit 41 is specifically arranged for the European FM band. Accordingly, the time interval between T1 and T2 includes 210 clock pulses since T must be adjustable to provide between 0 and 210 tuning steps. Correspondingly, the time intervals between T0 and T1 and between T2 and T3 include 65 clock pulses. Reset signal Q is a single clock pulse. A CD40103 COS/MOS integrated circuit "8 Stage Presettable Synchronous Down Counter" with J (Jam) and SPE (Synchronous Preset Enable) inputs and a CO/ZD (Carry Out/Zero Detect) output, available from RCA Corporation, Somerville, N.J., may be arranged as shown to provide the required timing signals. A suitable frequency clock pulse CP is between 100 and 150 KHz. Internallly generated timing signals H and I are shown in FIG. 2.

Figure 3:
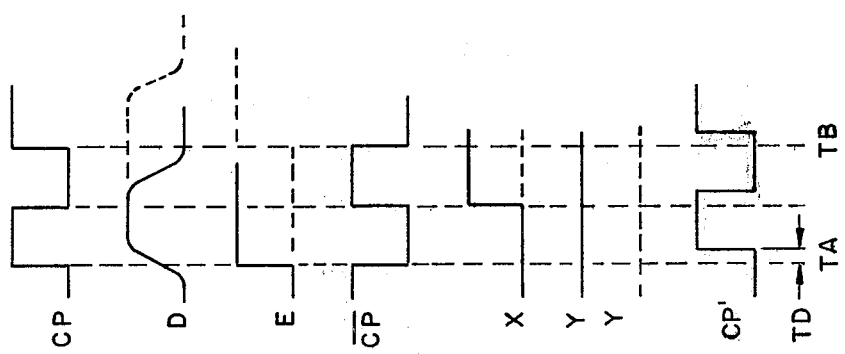

Hysteresis unit 51 will now be described with reference to FIG. 3. As earlier noted, hysteresis unit 51 operates to avoid any ambiguity which may arise when the rising edge of output signal D of comparator 49 and the rising edge of a corresponding clock pulse CP occur at substantially the same time. If the latter situation were to occur, in the presence of noise or jitter, J-K F-F 33 will not be reliably set at a time TA when ramp voltage B reaches wiper voltage C and output signal D of comparator 49 changes from the low level to the high level. As a result, J-K F-F 33 may be set at time TA or at time TB when the next clock pulse occurs and the duration T of clock time interval of signal E will vary randomly by one clock period. The two situations are indicated by the solid line and phantom line waveforms shown in FIG. 3. The variation of duration T of the counting interval will cause an instability in the 8 bit word coupled to programmable divider 17.

Hysteresis unit 51 selectively introduces a slight phase shift to the clock pulses coupled to the C input of J-K F-F 33 to avoid the situation described above. Specifically, hysteresis unit 51 includes a J-K F-F 75 and a D F-F 77. Like J-K F-F 33, the J input of J-K F-F 75 is responsive to output signal D of comparator 49. However, J-K F-F 75 is triggered in an out of phase relationship with respect to J-K F-F 33 by virtue of INVERTER 79 and is therefore reliably triggered. D (Data) F-F 77 compares the phase of a signal X generated at the Q output of J-K F-F 75 to the phase of a signal E generated at the Q output of J-K F-F 33. If signal E leads signal X (i.e., the transition of E from a low level to a high level occurs at time TA), the signal Y will be high. In response, an electronic switch 81 is closed and a phase shift network 83 comprising resistor 85, capacitor 87 and buffer INVERTERS 89 and 91 is enabled to add a small phase shift TD to clock pulses CP generated by ASMV 37 to produce the clock pulses CP' coupled to the C input of J-K F-F 33. The result is that the rising edge of output signal D of comparator 49 and the rising edge of the corresponding one of clock pulses CP' are not coincident and no ambiguity occurs. If signal E lags X (i.e., the transition of E from a low level to a high level occurs at time TB), no delay is added to clock pulses CP to produce clock pulses CP'. A suitable value for delay TD is between 5 and 10% of one clock period.

Figure 4:
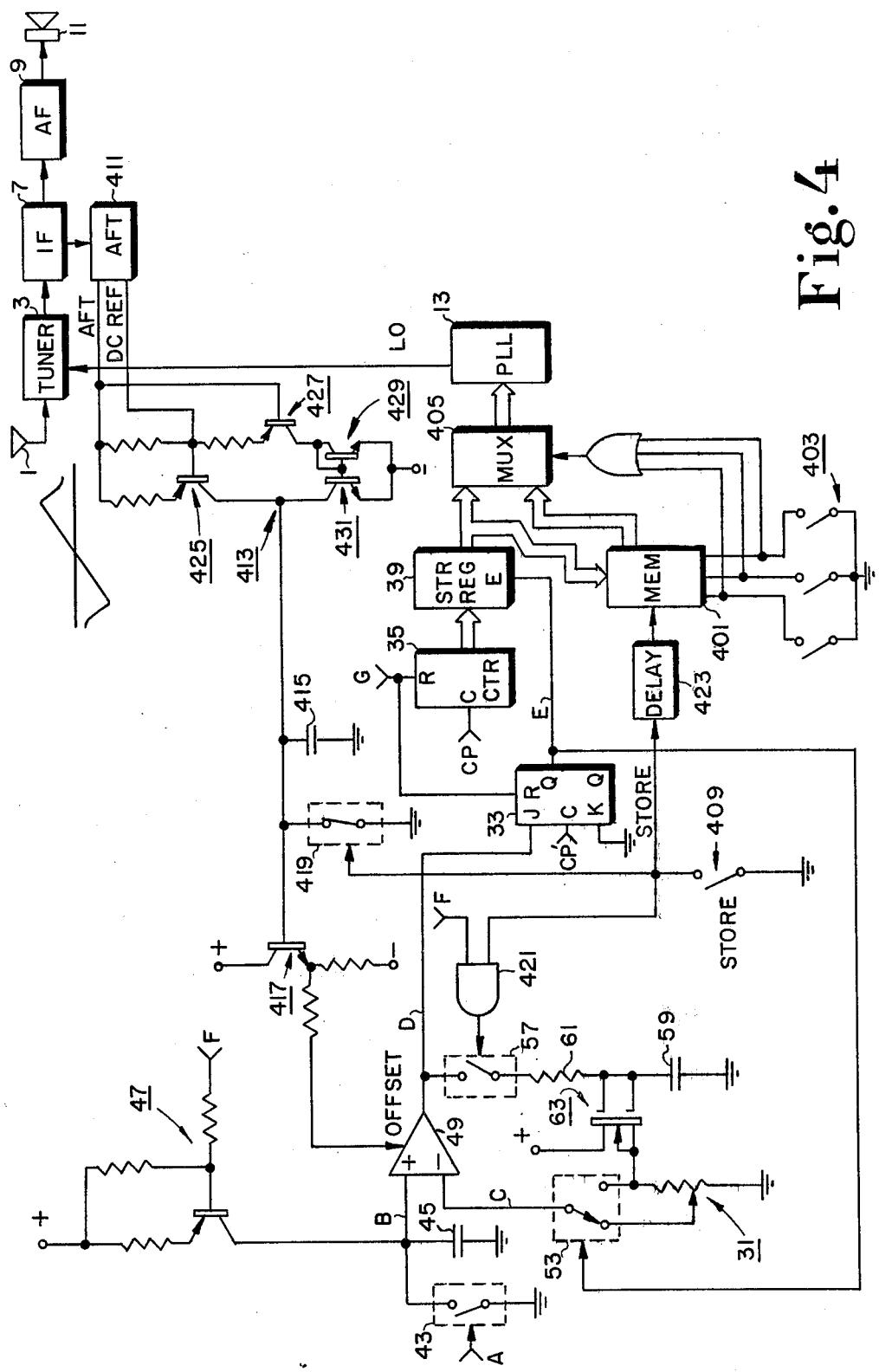

In the receiver shown in FIG. 4, provisions have been added so that a user may store binary words for controlling the programmable divider PLL 13 for a predetermined number, e.g., three, of preferred stations. The portions of the receiver shown in FIG. 4 corresponding to the same portions of the receiver shown in FIG. 1 are identified by the same reference numbers. The added provisions include a nonvolatile memory 401 and mechanical switches generally indicated as 403. Assuming that binary words for the preferred stations have already been stored in memory 401, when a user wishes to select one of the preferred stations he closes the corresponding one of switches 403. In response, the respective one of the memory locations of memory 401 is addressed and the binary word corresponding to that preselected station is read from memory 401 and coupled through a multiplexer (MUX) 405 to PLL 13. MUX 405 is a switching arrangement which normally couples the binary word stored in storage register 39 to PLL 13. However, when one of switches 403 is closed, MUX 405 is enabled by the output signal of an OR gate 407 to couple the binary word stored in the addressed memory location of memory 401 to PLL 13.

A user may enter the binary word corresponding to a preferred station by closing the corresponding one of switches 403 and a mechanical switch 409 after adjusting potentiometer 31 until the desired station is tuned. The closure of switch 409 causes a "store" signal to be generated which enables AFT provisions and causes the binary word stored in storage register 39 to be stored in memory 401 as will be described below. Since the user may not adjust potentiometer 31 to cause the station to be precisely tuned (i.e., the station may be mistuned to some degree), provisions are included in the receiver of FIG. 4 for correcting the binary word in response to an automatic fine tuning (AFT) signal for a preferred station before it is stored in memory 401. Specifically, an AFT signal generated by an AFT discriminator 411 is utilized to control duration T of the counting interval of signal E to correct for any slight misadjustment. The AFT signal has a conventional S-shaped discriminator characteristic having odd symmetry about a DC reference level (as shown in FIG. 4) and representing the deviation between the frequency of the actual IF signal and its nominal value (10.7 MHz for the European FM band). In resonse to the AFT signal a directional current source circuit 413 either charges or discharges a capacitor 415. The voltage developed across capacitor 415 is coupled by a voltage follower 417 to the offset input of comparator 49. The point at which ramp voltage B exceeds wiper voltage C and duration T of the counting interval will be altered accordingly. The CA3089 integrated circuit, available from RCA Corporation, Somerville, New Jersey, includes IF and AFT sections suitable for use in the receiver shown in FIG. 4. The CA3130 integrated circuit, also available from RCA Corporation, is an operational amplifier suitable for use as comparator 49.

Normally capacitor 415 is shunted by means of a closed electronic switch 419. Therefore, the AFT signal does not normally affect the binary tuning word. However, when push button 409 is closed, the "store" signal causes switch 419 to open and thereby allow capacitor 415 to be charged. In addition, when switch 409 is closed, the selfstabilization provisions are disabled by means of an AND gate 421 coupled to switch 57. In addition, the binary word generated by storage register 39 is not immediately stored in memory 401 when store push button 409 is closed because a delay unit 423 delays the "store" signal from reaching memory 401 until the AFT provisions have had time to take effect.

Directional current source 413 operates in the following manner. If the AFT signal is above the DC reference by a predetermined threshold, a PNP transistor 425 is rendered conductive (the predetermined threshold being determined by the base-emitter characteristics of transistor 425). As a result, a current flows through the emitter-collector junction of transistor 425 to charge capacitor 415. If the AFT signal is below the DC reference level by a predetermined threshold, a PNP transistor 427 is rendered conductive (the instant predetermined threshold being determined by the base-emitter characteristics of transistor 427). In response, a current flows through the emitter-collector junction of transistor 427 and the collector-emitter junction of a diode-connected NPN transistor 429. Transistor 429 is included with an NPN transistor 431 in a current mirror arrangement. Accordingly, the current flowing through the collector-emitter junction of transistor 431 is substantially the same as the current which flows through the collector-emitter junction of transistor 429. This latter current discharges capacitor 415. Since it is desirable that the same effect be produced for equal magnitudes of AFT signal above and below the DC reference level, transistors 425 and 427 should desirably be matched.

While the present invention has been described in terms of an European FM receiver, it will be appreciated that the programmable divider of the phase locked loop and the timing control unit may be altered to accommodate other tuning bands. These and other modifications are intended to be in the scope of the invention defined in the following claims.

What is claimed is:

1. Apparatus comprising: comparator means for generating an output signal having a first level when the amplitude of a first input signal exceeds the amplitude of a second input signal and a second level when the amplitude of said second input signal exceeds the amplitude of said first input signal;
   voltage divider means having a controllable voltage division ratio for generating said first input signal by the voltage division of a reference voltage;
   first capacitive means;
   first charging means for selectively charging said first capacitive means during a first predetermined period to generate said second input signal, said output signal changing levels at a time within said first predetermined period determined by said controllable division ratio;
   second capacitive means;
   second charging means for selectively charging said second capacitive means during a second predetermined period after said first predetermined period in response to the magnitude of said second input voltage at the end of said first predetermined period to develop said reference voltage; and
   utilization means responsive to said output signal for generating a binary word determined by the time interval between the beginning of said first predetermined period and said time when said output signal changes levels.

2. The apparatus recited in claim 1 wherein:
   said utilization means includes clock means for generating clock pulses; and
   counting means for counting said clock pulses during said time interval between the beginning of said first predetermined period and said time when said output signal changes level to generate said binary word.

3. The apparatus recited in claim 2 wherein:
   said utilization means includes flip-flop means for generating a control signal having first and second levels in response to said clock pulses and said output signal, the duration of said first level of said control signal being substantially equal to the time interval between the beginning of said first predetermined interval and the occurrence of the next one of said clock pulses generated after said output signal changes levels; and said counting means including storage means for storing the count accumulated by said counting means when said control signal changes from said first level to said second level.

4. The apparatus recited in claim 3 wherein:
   said utilization means includes coincidence inhibiting means for inhibiting said one clock pulse from occurring at substantially the same time said output signal changes levels.

5. The apparatus recited in claim 4 wherein:
   said coincidence inhibiting means includes hysteresis means for selectively shifting the phase of said clock signals with respect to said output signal in response to the phase relationship between said clock pulses and said control signal.

6. The apparatus recited in claim 2 wherein:
   said clock means includes astable multivibrator means for generating said clock pulses;
   said utilization means including timing control means for generating timing pulses for controlling said first and second charging means to control the selective charging of said first and second capacitive means in response to said clock pulses.

7. The apparatus recited in claim 6 wherein:
   said utilization means includes timing control means for generating first and second timing pulses in response to said clock pulses, the time interval between said first and second timing pulses being substantially equal to said first predetermined period, said second timing pulse having a duration substantially equal to said second predetermined period;
   said first charging means includes first switch means for selectively discharging said first capacitive means in response to said first timing pulse, said first charging means being disabled from charging said first capacitive means in response to said second timing pulse; and
   said second charging means includes resistance means and second switch means for selectively coupling said output signal to said second capacitive means through said resistance means in response to said second timing pulse.

8. The apparatus recited in claim 2 wherein:
   said utilization means includes phase locked loop means for generating a local oscillator signal for tuning a receiver to RF carriers, said phase locked loop means includes programmable divider means for determining the frequency of said local oscillator signal in response to said binary word.

9. The apparatus recited in claim 8 wherein:
   said receiver includes tuning means for combining said RF carriers and said local oscillator signal to generate an IF carrier; and automatic fine tuning means for generating an automatic fine tuning signal representing the deviation between the frequency of said IF carrier and a predetermined fixed frequency, said automatic fine tuning means including switch means for selectively coupling said automatic fine tuning signal to said comparator means; and said comparator means includes offset means for offsetting the amplitudes of said first and second input signals with respect to each other to control said time interval between the beginning of said first predetermined period and said time when said output signal changes levels in response to said automatic fine tuning signal; said second charging means being coupled to said switch means and being disabled from charging said second capacitive means when said automatic fine tuning signal is coupled to said comparator means.

10. The apparatus recited in claim 9 wherein:
    said utilization means includes memory means coupled to said switch means for storing said binary word generated by said counter means at a predetermined time after said automatic fine tuning signal is coupled to said comparator means.

* * * * *